(12) United States Patent
Cotte et al.

(10) Patent No.: US 6,683,008 B1
(45) Date of Patent: Jan. 27, 2004

(54) PROCESS OF REMOVING ION-IMPLANTED PHOTORESIST FROM A WORKPIECE

(75) Inventors: John Michael Cotte, New Fairfield, CT (US); Kenneth John McCullough, Fishkill, NY (US); Wayne Martin Moreau, Wappinger, NY (US); Keith R. Pope, Danbury, CT (US); John P. Simons, Wappingers Falls, NY (US); Charles J. Taft, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/299,130

(22) Filed: Nov. 19, 2002

(51) Int. Cl.⁷ ............... H01L 21/302; H01L 31/471; H01L 21/312
(52) U.S. Cl. ............... 438/745; 438/704; 510/176
(58) Field of Search ............... 430/270–290, 430/301–431; 205/666, 742; 510/176, 202; 257/E2; 438/704, 745–757

(56) References Cited

U.S. PATENT DOCUMENTS

| 5,651,860 | A | | 7/1997 | Li |
| 5,824,604 | A | | 10/1998 | Bar-Gadda |
| 5,866,005 | A | * | 2/1999 | DeSimone et al. ......... 210/634 |
| 5,873,948 | A | * | 2/1999 | Kim ........................ 134/19 |
| 5,882,489 | A | | 3/1999 | Bersin et al. |
| 5,895,272 | A | | 4/1999 | Li |
| 5,908,510 | A | | 6/1999 | McCullough et al. |
| 6,024,887 | A | | 2/2000 | Kuo et al. |
| 6,126,772 | A | | 10/2000 | Tamamoto et al. |
| 6,203,406 | B1 | | 3/2001 | Rose et al. |
| 6,403,544 | B1 | * | 6/2002 | Davenhall et al. ......... 510/175 |
| 6,500,605 | B1 | * | 12/2002 | Mullee et al. ............. 430/329 |
| 2002/0112740 | A1 | * | 8/2002 | DeYoung et al. ............. 134/3 |

FOREIGN PATENT DOCUMENTS

WO    WO 02/15251    2/2002

* cited by examiner

*Primary Examiner*—Matthew Smith
*Assistant Examiner*—Calvin Lee
(74) *Attorney, Agent, or Firm*—Scully, Scott, Murphy & Presser; Daniel P. Morris

(57) ABSTRACT

A process of removing photoresist, previously subjected to ion implantation, from the surface of a workpiece. The process involves contacting the workpiece with a composition which includes liquid or supercritical carbon dioxide and between about 2% and about 20% of an alkanol having the structural formula $C_xX_{2x+1}OH$, where X is fluorine, hydrogen or mixtures thereof; and x is an integer of 1 to 8, said percentages being by volume, based on the total weight of the composition.

14 Claims, 1 Drawing Sheet

PROCESS OF REMOVING ION-IMPLANTED PHOTORESIST FROM A WORKPIECE

BACKGROUND OF THE DISCLOSURE

1. Field of the Invention

The present invention is directed to a process of removing ion-implanted photoresist from a workpiece. More specifically, the present invention is directed to a process of removing hardened photoresist, disposed on a workpiece, that has previously been exposed to ion implant processing, utilizing a composition which includes liquid or supercritical carbon dioxide and an alkanol.

2. Background of the Prior Art

The employment of photoresists in lithographic processes in the fabrication of workpieces, to precisely position transistors, resistors, interconnects and the like thereon, is ubiquitous in the art. Another common processing step in the formation of workpieces is ion implantation which is utilized in the manufacture of large scale integrated circuits. Ion implantation, utilizing ion beams, is employed to implant regions of a workpiece with a controllable level of heterogeneous ionic impurities in order to create wells of either excess positive or negative charge. This doping method affords a precise way of defining electronic band structure and conductivity in the local areas which will ultimately become electronically active parts of a solid state electronic device or circuit.

In defining regions of positive and negative charge, and in conjunction with other integrating processing steps, it is sometimes necessary to carry out implant processing through a layer of masking material or photoresist which may inadvertently become crosslinked, hardened or otherwise chemically or physically changed by the incident ion beam in its passage through the photoresist layer. As a result the "implanted photoresist" material is rendered more difficult to remove by solvent dissolution means and thus presents a problem in workpiece manufacturing.

The aforementioned problem has been identified in the art. Thus, methods are known for removing implanted photoresist which, although effective in removing the photoresist, requires the workpiece to be subjected to long wet chemical processing operations, high temperature and pressure or both. This, in turn, limits the materials that can be utilized as the photoresist subjected to ion implantation.

As stated above, methods of removing resists are known in the art. One such method, disclosed in U.S. Pat. Nos. 5,651,860 and 5,895,272, involves hydrogenating the resist material by immersing that material in pressurized boiling water.

U.S. Pat. No. 5,882,489 sets forth a method of removing a resist layer, particularly in via holes, in surfaces of semiconductor wafers. In this process the resist layer is ashed to form a soluble organic compound which is rinsed off in water. Subsequently, the ashed and rinsed semiconductor device is subjected to sputtering in an etching and stripping chamber to sputter away the resist layer.

U.S. Pat. No. 5,824,604 describes another method of removing photoresist from a substrate which entails little etching of oxide from the substrate surface. In this process the substrate, upon which photoresist is disposed, is contacted with a plasma which includes an oxidizing gas, a halogen-containing compound and a hydrocarbon that releases hydrogen under plasma-forming conditions.

Yet another method, disclosed in U.S. Pat. No. 6,024,887, of stripping a photoresist layer from a substrate, wherein the photoresist layer is specifically directed to an ion implanted photoresist layer, involves treating the ion implanted photoresist layer with a first plasma employing a first etchant gas composition comprising a fluorine-containing species. Thereupon, a second plasma, employing a second etchant gas composition, which includes an oxygen-containing species, results in stripping of the ion implanted photoresist layer from the substrate without plasma-induced damage to the substrate.

U.S. Pat. No. 6,126,772 sets forth still another method of resist removal. In this method an adhesive layer is formed on an article on which a resist is disposed. The adhesive layer may be applied before or subsequent to the deposition of the photoresist layer. It is imperative, however, that the adhesive layer have a modulus of elasticity of at least 1 $Kg/mm^2$, independent of whether the adhesive layer is curable or not. Upon formation of the adhesive layer, that layer is peeled from the article as a unitary sheet thus removing the resist material which remains attached to the adhesive layer.

U.S. Pat. No. 6,203,406 mentions yet still another method of removing photoresist. In this method a high velocity aerosol of at least partially frozen particles is directed at a foreign material, which may be a photoresist, on the surface of a substrate.

The use of liquid or supercritical carbon dioxide in the removal of residue, which may be formed from stripped photoresist, is disclosed in U.S. Pat. No. 5,908,510. However, the use of liquid or supercritical carbon dioxide in the removal of hardened photoresist is not disclosed or suggested by this reference.

International Publication WO 02/15251 teaches the removal of photoresist and photoresist residue from semiconductors using supercritical carbon dioxide. In this process photoresist, on the surface of a semiconductor, is removed by disposing that photoresist-covered semiconductor substrate in a pressure chamber with supercritical carbon dioxide and a stripper chemical in which the maximum pressure is maintained at 6,000 psig.

The disadvantages of the process described in the '251 publication resides in the requirement that a strong stripper chemical, having detrimental environmental effects, must be employed in the photoresist removal step. Moreover, that process, which introduces environmental dangers, does not address the most difficult to remove photoresists, those which were previously ion-implanted.

The present state of the art, summarized above, strongly suggests the need for a new process which permits simplified photoresist removal consistent with non-detrimental environmental consequences.

BRIEF SUMMARY OF THE INVENTION

A new process for removing photoresist from a workpiece has now been developed which is highly effective and which liberates substantially no environmentally dangerous material into the atmosphere.

In accordance with the present invention a new process is provided which includes the steps of contacting a workpiece, upon which a photoresist, previously exposed to ion etching, is disposed, with a composition which comprises a mixture of liquid or supercritical carbon dioxide and an alkanol, said alkanol present in a concentration of between about 2% and about 20%, said percentages being by volume, based on the total volume of the composition.

BRIEF DESCRIPTION OF THE DRAWING

The present invention will be better understood by reference to the accompanying drawing which is a schematic representation of an apparatus employed in the removal of photoresist from a workpiece.

DETAILED DESCRIPTION

Figure 1:
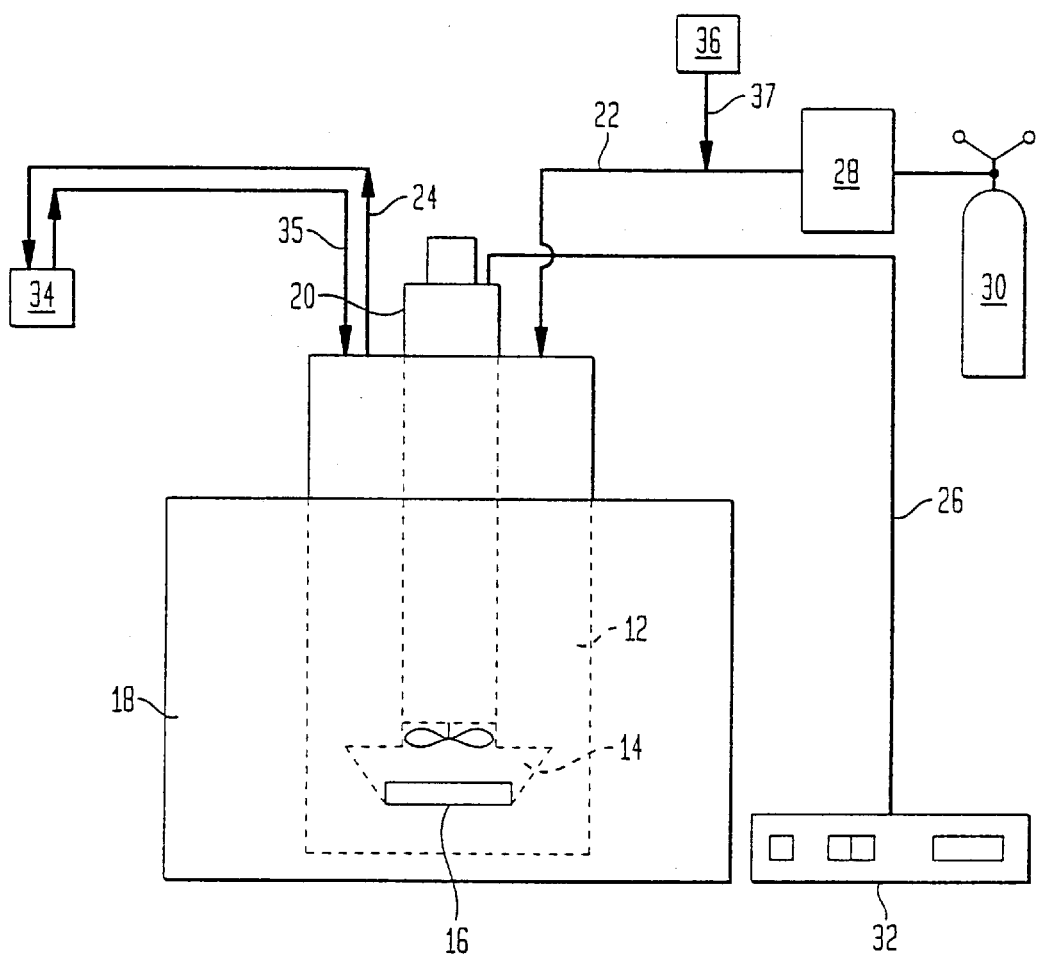

The process of the present invention is preferably conducted in an apparatus especially suitable for processing under thermodynamic conditions consistent with the maintenance of carbon dioxide in the liquid or supercritical state. Such an apparatus is depicted in the drawing. Therein an apparatus is provided for removing ion-implanted photoresist from a workpiece, depicted therein by reference numeral 16. The apparatus includes process chamber 12, having a sample zone 14, surroundedly by heating jacket 18 and provided with a stirring mechanism 20. Additionally, process chamber 12 is in fluid communication with an inlet line 22, an outlet line 24 and a thermocouple 26. The inlet line 22 is in fluid communication with a high pressure pumping system 28 connected to cylinder 30 for supplying carbon dioxide into process chamber 12. Thermocouple 26 is in communication with a heat controller 32 for monitoring and controlling the temperature in the process chamber 12. The apparatus includes a reservoir 34 for collecting and/or purifying liquid or supercritical carbon dioxide introduced therein through duct 24. The collected and/or purified liquid or supercritical carbon dioxide may then be recycled into process chamber 12 through recycle duct 35.

The apparatus is also provided with a reservoir or container 36 in which an alkanol is disposed. This container 36 is in fluid communication with inlet line 22 though conduit 37 to supply a composition of liquid or supercritical carbon dioxide and alkanol into processing chamber 12.

Processing, as described below, occurs in chamber 12 upon workpiece 16 on whose surface a photoresist, subjected to ion-implantation, is disposed.

The workpiece, upon whose surface a photoresist is removed may be semiconductor wafers, photomasks, microelectromechanical devices (MEMs) and the like. Typically, however, photomasks and MEMs are not subject to ion implantation. Photoresists exposed to ion implantation, especially those subjected to high dosage ion implantation, and most especially, ion implantation in the order of at least about $10^{15}$ ions per $cm^2$ are crosslinked, hardened or otherwise chemically or physically changed by the incident ion beam. As such, complete removal of "implanted resist" material is almost impossible by standard solvent dissolution methods. Therefore, the above-discussed oxidizing plasma and ashing techniques are usually utilized. These processing methods have detrimental effects on the workpiece and thus the recently developed process of employing supercritical carbon dioxide in combination with strong stripping chemicals, supra, has been developed. Unfortunately, strong stripping chemicals, although effective, if utilized in high enough concentration, represent a significant environmental hazard.

The present invention employs a novel composition which comprises supercritical carbon dioxide and an alkanol. The alkanol of the present invention is a straight or branched chain molecule having the structural formula $C_xX_{2x+1}OH$, where X is fluorine, hydrogen or a mixture thereof; and x is an integer of 1 to 8. More preferably, X is hydrogen; and x is an integer of 1 to 4. Thus, preferred alcohols include methanol, ethanol, n-propanol, isopropanol, n-butanol, isobutanol and tert-butanol. Of these, methanol is particularly preferred.

In a preferred embodiment, the composition of the present application includes the alkanol in a concentration in the range of between about 2% to about 20%, said percentages being by volume, based on the total volume of the composition. More preferably, the composition comprises between about 5% and about 15% by volume alkanol. Still more preferably, the composition comprises between about 8% volume and about 12% volume alkanol As suggested above, the present invention employs no stripping agent. Thus, the composition of the present invention does not include any stripping agent, employed in liquid or supercritical carbon dioxide-containing compositions used to remove photoresists from workpieces of the prior art. Among the stripping agents which are included in compositions of the prior art which include liquid or supercritical carbon dioxide are such compounds as catechol, hydroxylamine, ethanolamine, diisopropylamine, triisopropylamine, diglycolamine, dimethylformamide, N-methyl pyrollidone, acetic acid, hexamethyldisilazane, trichloroacetic acid, tetralkylammonium hydroxide, where the alkyl contains 1 to 4 carbon atoms, fluorinated analogs of tetraalkylammonium hydroxide, where the alkyl contains 1 to 4 carbon atoms, and mixtures thereof.

The present invention involves removal of photoresist under thermodynamic conditions consistent with the maintenance of carbon dioxide in the liquid or supercritical state. Thus, it is preferred that these thermodynamic conditions include processing at a temperature in the range of between about 60° C. and about 100° C. More preferably, the temperature is in the range of between about 65° C. and about 85° C. Still more preferably, the temperature under which the process of the present invention is conducted is in the range of between about 70° C. and about 75° C.

The pressure under which the process is conducted is in the range of between about 5000 psi and about 7500 psi. Preferably, the pressure is in the range of between about 5500 psi and about 6500 psi. More preferably, the pressure is in the range of between about 5800 psi and about 6200 psi.

The following examples are provided to illustrate the scope of the present invention. Because these examples are provided for illustrative purposes only, the scope of the invention should not be deemed limited thereto.

EXAMPLES

A series of semiconductor were coated with photoresists, most of which were ion implanted. These difficult to remove photoresist coatings were contacted with carbon dioxide with or without one or more additional solvents. This contact took place in the apparatus illustrated in the drawing and described hereinabove.

The results of these photoresist removal examples, all conducted under thermodynamic conditions resulting in the carbon dioxide was in the supercritical state, are summarized in the Table below.

TABLE

| | | | Thermodynamic Conditions | | | | |
|---|---|---|---|---|---|---|---|
| Ex. No. | Photoresist[1] | Implant[2] | Pressure, bars | Temp, ° C. | Time, hr. | Solvent[3] | % Photoresist Removed |
| 1 | MUV | None | 204 | 35 | 0.5 | Methanol | 100 |
| 2 | MUV | None | 204 | 35 | 0.5 | None | 0 |
| 3 | MUV | None | 400 | 100 | 1 | Methanol | 100 |
| 4 | MUV | PE15 | 400 | 100 | 1 | Methanol | 100 |

TABLE-continued

Thermodynamic Conditions

| Ex. No. | Photoresist[1] | Implant[2] | Pressure, bars | Temp, °C. | Time, hr. | Solvent[3] | % Photoresist Removed |
|---|---|---|---|---|---|---|---|
| 5 | MUV | PE15 | 204 | 35 | 0.5 | NMP[4] | 0[11] |
| 6 | MUV | PE15 | 418 | 40 | 0.5 | NMP | 30 |
| 7 | MUV | PE15 | 400 | 70 | 1 | NMP | 100 |
| 8 | MUV | PE15 | 420 | 70 | 1 | HMDS[5] | 10 |
| 9 | MUV | PE15 | 418 | 40 | 0.5 | NMP/HMDS | 20 |
| 10 | MUV | PE15 | 418 | 40 | 0.5 | DMF[6]/HMDS | 100 |
| 11 | MUV | PE15 | 420 | 70 | 1 | DMF/HMDS | 80 |
| 12 | MUV | PE15 | 400 | 70 | 1 | DMF/HMDS | 50 |
| 13 | MUV | PE15 | 400 | 60 | 1 | TCA[7]/AA[8] | 20 |
| 14 | MUV | PE15 | 400 | 60 | 1 | BuCO3[9] | 30 |
| 15 | DUV | PE16 | 400 | 100 | 1 | Methanol | 100 |
| 16 | DUV | PE16 | 200 | 60 | 1 | NMP | 70 |
| 17 | DUV | PE16 | 400 | 60 | 1 | NMP | 90 |
| 18 | DUV | PE16 | 400 | 60 | 1 | BuCO$_3$ | 0[11] |
| 19 | DUV | Arc-PE16 | 400 | 100 | 1 | Methanol | 100 |
| 20 | DUV | Arc-PE16 | 400 | 70 | 1 | NMP/TMAH[10] | 30 |

[1]Photoresist Definitions: MUV is mid ultraviolet and DUV is deep ultraviolet.
[2]Implant Definitions represent the number of atoms of phosphorus implanted into photoresist. Specifically, PE15 represents $e^{15}$ atoms of P, PE16 represents $e^{16}$ atoms of P and arc-PE16 represents $e^{16}$ atoms implanted with an anti-reflective coating applied to the wafer surface.
[3]Where two solvents are recited, the solvent is a mixture of the two solvents.
[4]NMP is N-methyl pyrrolidone
[5]HMDS is hexamethyldisilazane
[6]DMF is dimethylformamide
[7]TCA is trichloroacetic acid
[8]AA is acetic acid
[9]BuCO3 is butylene carbonate
[10]TMAH is tetramethylammonium hydroxide.
[11]Although no photoresist removed, there was edge penetration of the photoresist coating.

The above embodiments and examples are given to illustrate the scope and spirit of the present invention. These embodiments and examples will make apparent, to those skilled in the art, other embodiments and examples. Those other embodiments and examples are within the contemplation of the present invention. Therefore, the present invention should be limited only by the appended claims.

What is claimed is:

1. A process of removing photoresist previously subjected to ion implantation from a workpiece comprising contacting a workpiece, upon which a photoresist, previously subjected to ion implantation, is disposed, with a composition comprising liquid or supercritical carbon dioxide and an alkanol having the structural formula $C_xX_{2x+1}OH$, where X is fluorine, hydrogen or mixtures thereof; and x is an integer of 1 to 8, wherein said alkanol is present in a concentration in the range of between about 2% and about 20%, said percentages being by volume, based on the total volume of the composition.

2. A process in accordance with claim 1 wherein said alkanol is present in a concentration of between about 5% and about 15%.

3. A process in accordance with claim 2 wherein said alkanol is present in a concentration of between about 8% and about 12%.

4. A process in accordance with claim 1 wherein x is 1 to 4.

5. A process in accordance with claim 4 where X is hydrogen.

6. A process in accordance with claim 5 wherein said alkanol is methanol, ethanol, n-propanol, isopropanol, n-butanol, isobutanol and t-butanol.

7. A process in accordance with claim 1 wherein said ion implantation to which said photoresist was previously subjected is at least about $10^{15}$ ions/cm$^2$.

8. A process in accordance with claim 1 wherein said composition is free of any stripping agent.

9. A process of removing photoresist previously subjected to ion implantation from a workpiece comprising contacting a workpiece, upon which a photoresist, previously subjected to ion implantation, with carbon dioxide and an alkanol having the structure formula $C_xX_{2x+1}OH$, where X is hydrogen, fluorine or mixtures thereof; and x is an integer of 1 to 8, said alkanol present in a concentration of between about 2% and about 20%, said percentages being by volume, based on the total volume of said carbon dioxide and said alkanol, at a pressure in the range of between about 5000 psi and about 7,500 psi and a temperature in the range of between about 60° C. and about 100° C.

10. A process in accordance with claim 9 wherein said workpiece is contacted at a pressure in the range of between about 5,500 psi and about 6,500 psi and a temperature in the range of between about 65° C. and about 85° C.

11. A process in accordance with claim 10 wherein said alkanol is present in a concentration of between about 5% and about 15%.

12. A process in accordance with claim 11 wherein x is an integer of 1 to 4.

13. A process in accordance with claim 12 wherein said workpiece is contacted at a pressure of about 5,800 psi and about 6,200 psi and a temperature of about 70° C. and about 75° C.

14. A process in accordance with claim 9 wherein said alkanol is methanol.

* * * * *